US012609233B2

(12) United States Patent
Imasaka et al.

(10) Patent No.: US 12,609,233 B2
(45) Date of Patent: Apr. 21, 2026

(54) TRANSFORMER DEVICE AND SEMICONDUCTOR DEVICE

(71) Applicant: Mitsubishi Electric Corporation, Tokyo (JP)

(72) Inventors: Toshihiro Imasaka, Tokyo (JP); Manabu Yoshino, Tokyo (JP); Yasuo Yamaguchi, Tokyo (JP); Yohei Torii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1233 days.

(21) Appl. No.: 17/495,785

(22) Filed: Oct. 6, 2021

(65) Prior Publication Data

US 2022/0223332 A1 Jul. 14, 2022

(30) Foreign Application Priority Data

Jan. 13, 2021 (JP) ................................. 2021-003487

(51) Int. Cl.
*H01L 23/532* (2006.01)
*H01F 17/00* (2006.01)
(Continued)

(52) U.S. Cl.
CPC ..... *H01F 27/2804* (2013.01); *H01F 17/0013* (2013.01); *H01L 23/5227* (2013.01);
(Continued)

(58) Field of Classification Search
CPC ....... H10D 1/20; H01L 24/48; H01L 23/5227; H01L 23/645; H01L 23/53295;
(Continued)

(56) References Cited

U.S. PATENT DOCUMENTS

2002/0011669 A1 1/2002 Fujiki et al.
2005/0054188 A1 3/2005 Matsuura et al.
(Continued)

FOREIGN PATENT DOCUMENTS

CN 103887287 A 6/2014
DE 199 45 820 A1 8/2000
(Continued)

OTHER PUBLICATIONS

An Office Action; "Notice of Reasons for Refusal," mailed by the Japanese Patent Office on Mar. 5, 2024, which corresponds to Japanese Patent Application No. 2021-003487 and is related to U.S. Appl. No. 17/495,785; with English language translation.
(Continued)

*Primary Examiner* — Omar F Mojaddedi
(74) *Attorney, Agent, or Firm* — Studebaker Brackett PLLC

(57) ABSTRACT

A transformer device includes: a planar first coil; a first insulation layer being provided above the first coil; an intermediate layer being provided above the first insulation layer; a second insulation layer being provided above the intermediate layer; a planar second coil being provided above the second insulation layer and facing the first coil; and a pad having conductivity being provided above the second insulation layer and being connected to one end side of the second coil. The pad is disposed at a position at least partially overlapping the intermediate layer in plan view. The intermediate layer has hardness higher than hardness of the first insulation layer and the second insulation layer.

30 Claims, 12 Drawing Sheets

<u>200</u>

(51) Int. Cl.

| | | |
|---|---|---|
| *H01F 27/28* | (2006.01) | |
| *H01L 23/522* | (2006.01) | |
| *H01L 23/64* | (2006.01) | |
| *H10D 1/20* | (2025.01) | |

(52) U.S. Cl.
CPC ............. *H01L 23/645* (2013.01); *H10D 1/20* (2025.01); *H01F 2017/002* (2013.01); *H01F 2027/2809* (2013.01); *H01F 2027/2819* (2013.01); *H01L 23/53295* (2013.01)

(58) Field of Classification Search
CPC ........ H01F 5/04; H01F 27/2804; H01F 27/29; H01F 27/306; H01F 27/324
See application file for complete search history.

(56) References Cited

U.S. PATENT DOCUMENTS

| | | | | |
|---|---|---|---|---|
| 2014/0175602 A1* | 6/2014 | Funaya | ............. | H01L 23/49575 |
| | | | | 438/381 |

| | | | | |
|---|---|---|---|---|
| 2018/0096783 A1* | 4/2018 | Fukuda | ................. | H01F 27/366 |
| 2019/0088413 A1* | 3/2019 | Kawaguchi | ............. | H01F 27/24 |

FOREIGN PATENT DOCUMENTS

| | | |
|---|---|---|
| JP | H10-199925 A | 7/1998 |
| JP | 2001-007113 A | 1/2001 |
| JP | 2005-085939 A | 3/2005 |
| JP | 2014-123671 A | 7/2014 |
| JP | 2017-118128 A | 6/2017 |

OTHER PUBLICATIONS

Office Action issued in DE 10 2021 130 732.5; mailed by the German Patent and Trademark Office on Feb. 28, 2025.
An Office Action; mailed by the China National Intellectual Property Administration of the People's Republic of China on Nov. 29, 2024, which corresponds to Chinese Patent Application No. 202210017074.0 and is related to U.S. Appl. No. 17/495,785.

* cited by examiner

F I G.   1
200
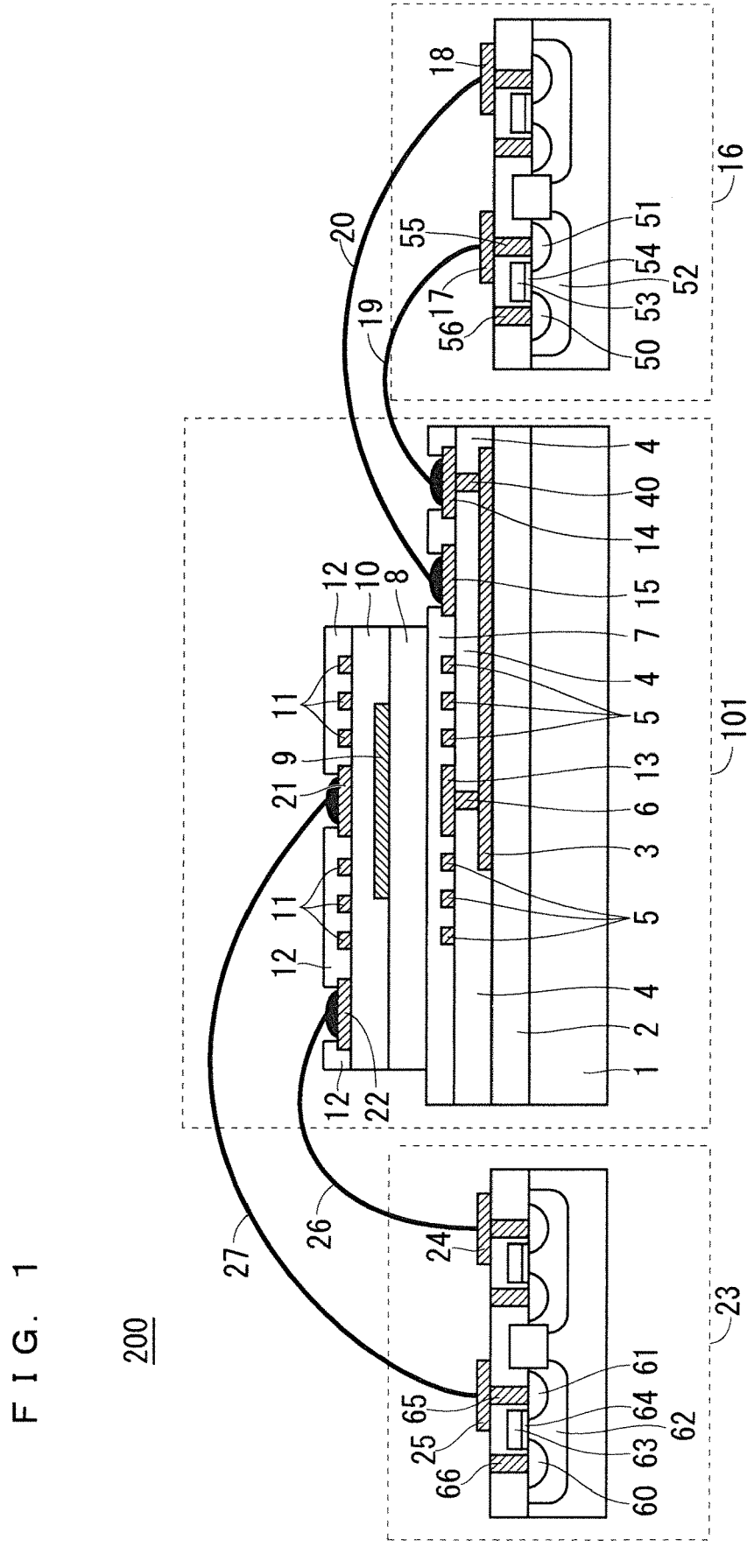

F I G.  2
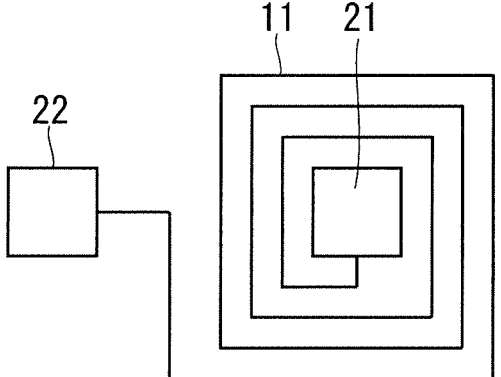

F I G.   3
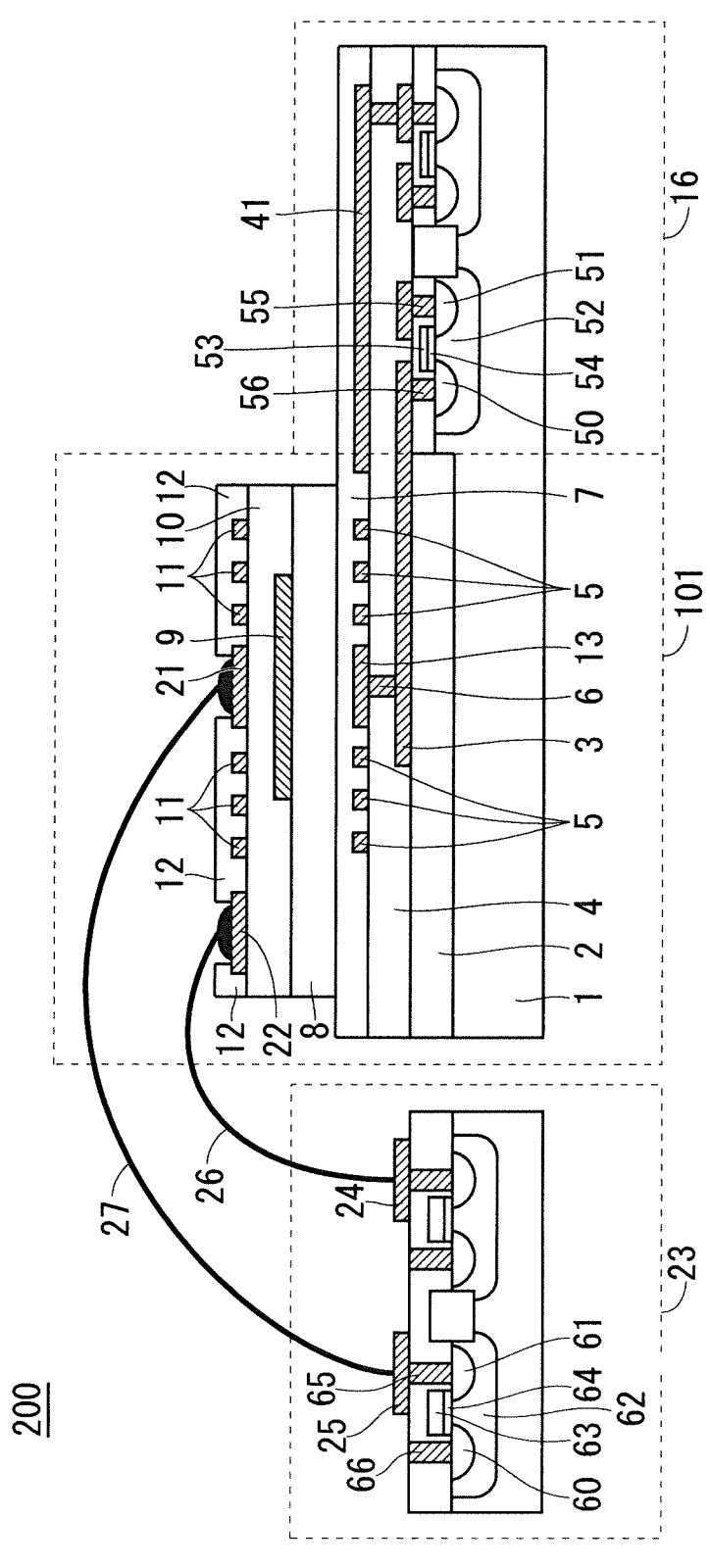

F I G.  4
101
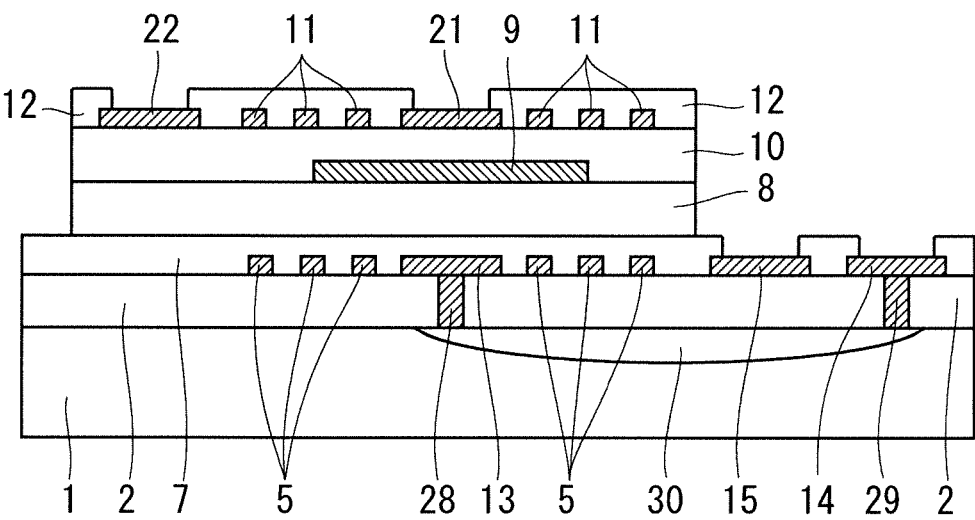

F I G   5
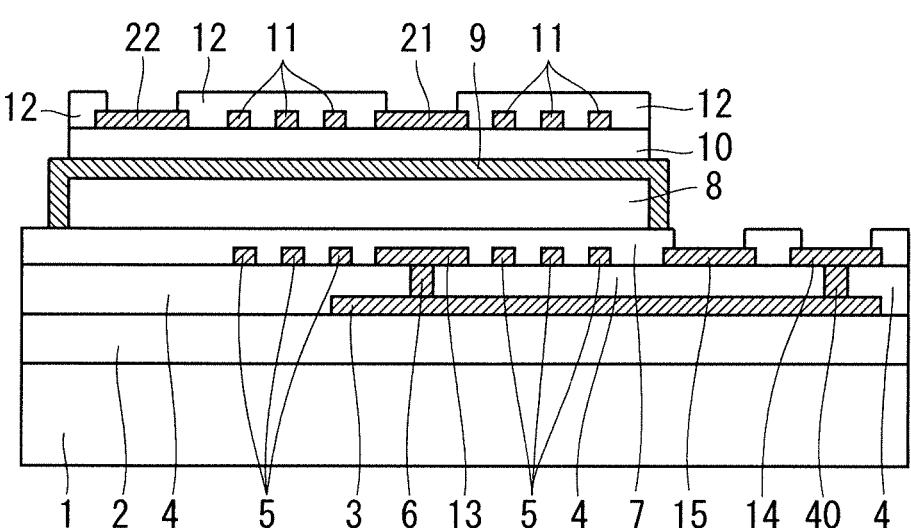
102

F I G.   6
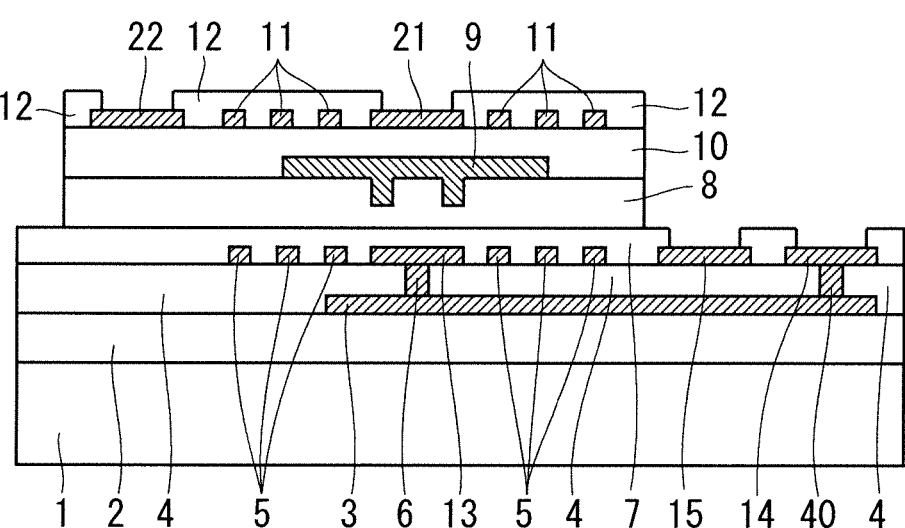
103

F I G. 7
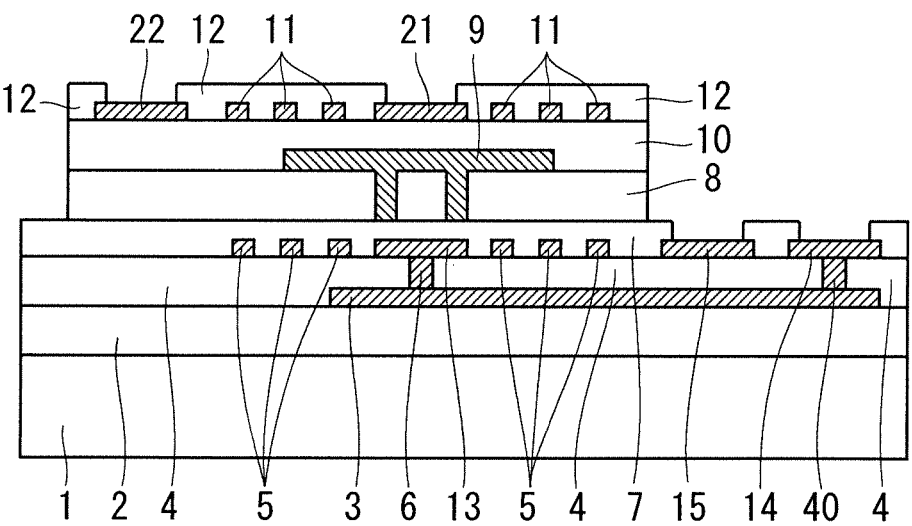

F I G. 8
<u>105</u>
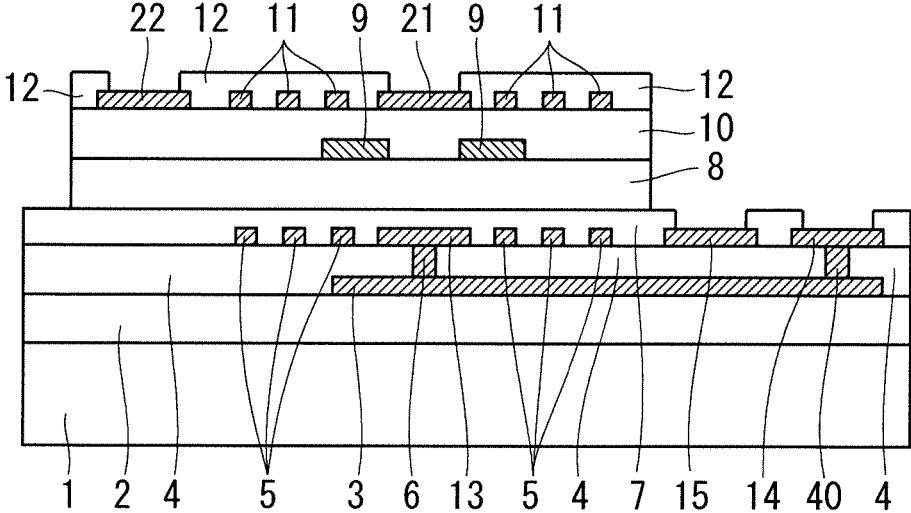
1   2   4     5     3   6   13   5   4   7   15    14   40   4

F I G. 9
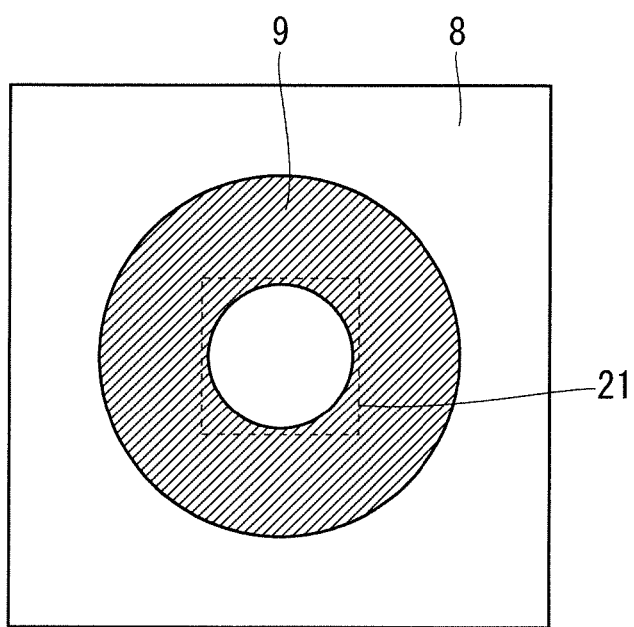

106

F I G. 1 1
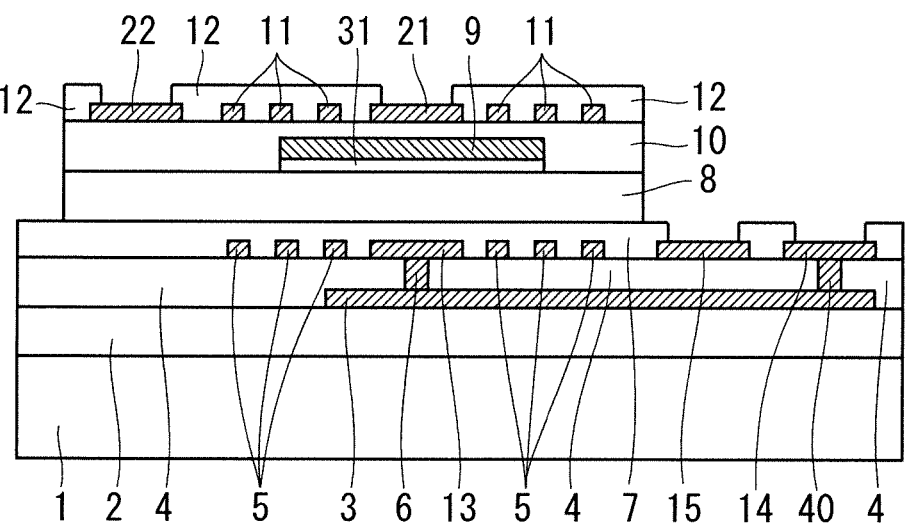

F I G. 1 2
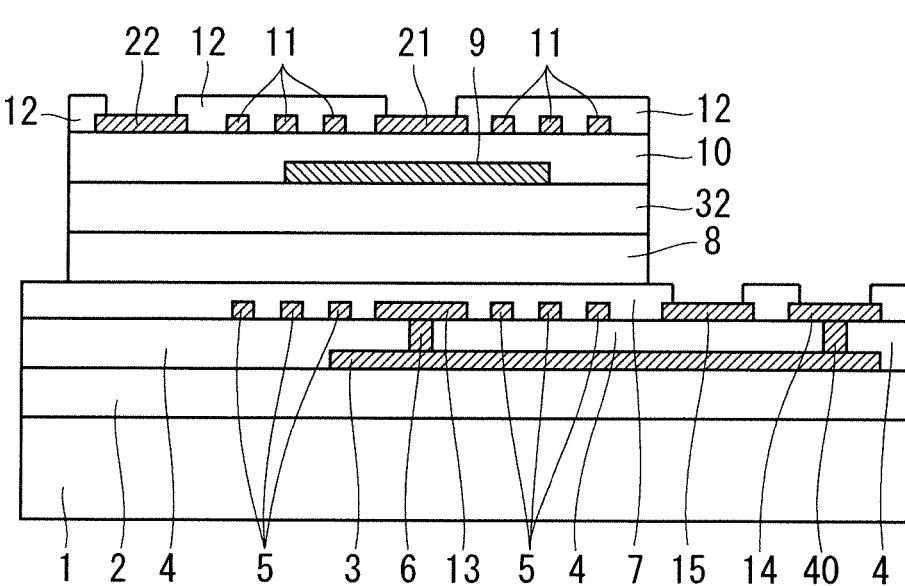

TRANSFORMER DEVICE AND SEMICONDUCTOR DEVICE

BACKGROUND OF THE INVENTION

Field of the Invention

The present disclosure relates to a transformer device and a semiconductor device.

Description of the Background Art

As known examples of a means for transmitting signals between two circuits operating with different reference potentials, there are a technology of forming a coreless transformer on a semiconductor substrate and a technology of using an organic insulation film as an insulation layer between coils of a coreless transformer. Such technologies are disclosed in, for example, Japanese Patent Application Laid-Open No. 2017-118128.

In the related art, there is a problem in that, when a wire is bonded to a pad formed above an insulation layer that insulates coils from each other, the insulation layer is deformed, causing reduction in quality of joining.

SUMMARY

The present disclosure has an object to provide a transformer device that can join with high quality a wire to a pad above an insulation layer that insulates coils from each other, and a semiconductor device including the transformer device.

A transformer device according to a first aspect of the present disclosure includes: a planar first coil; a first insulation layer being provided above the first coil; an intermediate layer being provided above the first insulation layer; a second insulation layer being provided above the intermediate layer; a planar second coil being provided above the second insulation layer and facing the first coil; and a pad having conductivity being provided above the second insulation layer and being connected to one end side of the second coil. The pad is disposed at a position at least partially overlapping the intermediate layer in plan view. The intermediate layer has hardness higher than hardness of the first insulation layer and the second insulation layer. With the configuration described above, a transformer device that can join with high quality a wire to a pad above an insulation layer that insulates coils from each other can be provided.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a diagram illustrating a semiconductor device according to the first embodiment.

FIG. 2 is a plan view of a wire layer and pads of the semiconductor device according to the first embodiment.

FIG. 3 is a diagram illustrating a modification of the semiconductor device according to the first embodiment.

FIG. 4 is a diagram illustrating a modification of the semiconductor device according to the first embodiment.

FIG. 5 is a diagram illustrating a semiconductor device according to the second embodiment.

FIG. 6 is a diagram illustrating a semiconductor device according to the third embodiment.

FIG. 7 is a diagram illustrating a semiconductor device according to the fourth embodiment.

FIG. 8 is a diagram illustrating a semiconductor device according to the fifth embodiment.

FIG. 9 is a plan view of an intermediate layer and an insulation layer of the semiconductor device according to the fifth embodiment.

FIG. 11 is a diagram illustrating a modification of the semiconductor device according to the sixth embodiment.

FIG. 12 is a diagram illustrating a semiconductor device according to the seventh embodiment.

DESCRIPTION OF THE PREFERRED EMBODIMENTS

Figure 10:
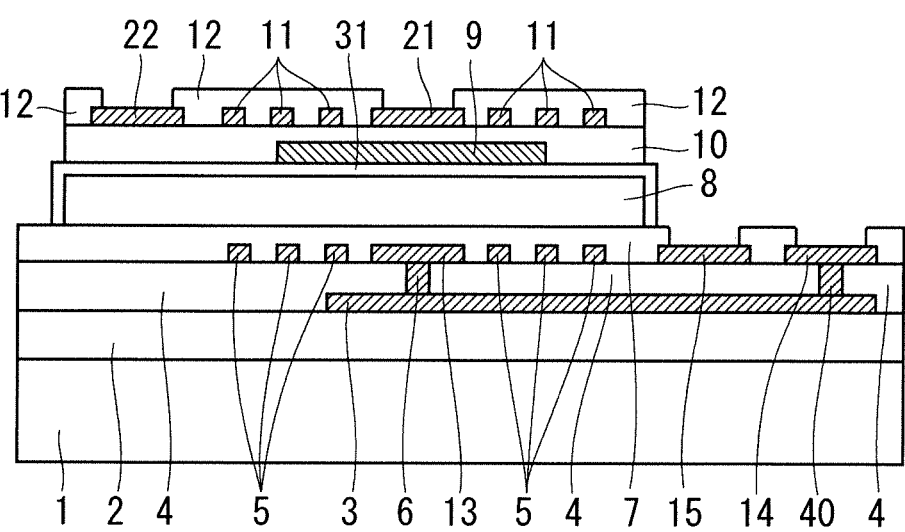
FIG. 10 is a diagram illustrating a semiconductor device according to the sixth embodiment.

In the following description, regarding the expressions of "up" and "low", a direction of a transformer device or a semiconductor device is represented as an upper direction and a direction opposite to the upper direction is represented as a lower direction, and those expressions are not to limit upper and lower directions when the transformer device or the semiconductor device is manufactured or used.

A. First Embodiment

A-1. Configuration

FIG. 1 is a diagram illustrating a semiconductor device 200 according to the present embodiment.

The semiconductor device 200 includes a transformer device 101, a circuit region 16, and a circuit region 23.

The transformer device 101 includes a substrate 1, an insulation layer 2 provided on the upper surface of the substrate 1, a wire layer 3 provided on a partial region of the upper surface of the insulation layer 2, an insulation layer 4 provided on the upper surface of the wire layer 3 and on a region of the upper surface of the insulation layer 2 in which the wire layer 3 is not provided, a wire layer 5 provided in a partial region on the upper surface of the insulation layer 4, an insulation layer 7 provided on a region of the upper surface of the insulation layer 4 in which the wire layer 5 is not provided and on the upper surface of the wire layer 5, an insulation layer 8 (one example of a first insulation layer) provided on the upper surface of the insulation layer 7, an intermediate layer 9 provided on a partial region of the upper surface of the insulation layer 8, an insulation layer 10 (one example of a second insulation layer) provided on a region of the upper surface of the insulation layer 8 in which the intermediate layer 9 is not provided and on the upper surface of the intermediate layer 9, a wire layer 11 provided on a partial region of the upper surface of the insulation layer 10, a pad 21 provided on a partial region of the upper surface of the insulation layer 10, a pad 22 provided on a partial region of the upper surface of the insulation layer 10, and an insulation layer 12 provided on a region of the upper surface of the insulation layer 10 in which none of the wire layer 11, the pad 21, or the pad 22 is provided and on the wire layer 11.

In plan view, outer circumferential portions of the pad 21 and the pad 22 are covered by the insulation layer 12, and center portions of the pad 21 and the pad 22 are not covered by the insulation layer 12.

The pad 21 is disposed at a position at least partially overlapping the intermediate layer 9 in plan view. The pad 21 is, for example, disposed so that the entire pad 21 overlaps the intermediate layer 9. FIG. 1 illustrates a case in which the pad 21 is disposed at a position at least partially overlapping the intermediate layer 9 in plan view; however, the pad 22, instead of the pad 21, may be disposed at a position at least partially overlapping the intermediate layer 9 in plan view, and both of the pad 21 and the pad 22 may be disposed at positions at least partially overlapping the intermediate layer 9 in plan view.

The intermediate layer 9 is formed so as not to protrude from the upper surface of the insulation layer 8. In FIG. 1, the intermediate layer 9 is formed on a partial region of the upper surface of the insulation layer 8. Note that the intermediate layer 9 may be formed on the entire upper surface of the insulation layer 8. In plan view, if the intermediate layer 9 is formed in substantially the same region as the insulation layer 8, e.g., if outer circumference of the intermediate layer 9 is included in a region within 1.5 μm from outer circumference of the insulation layer 8, at the time of manufacture, the intermediate layer 9 can be formed using the same mask as that used when the insulation layer 8 is formed.

The intermediate layer 9 has hardness higher than that of the insulation layer 8 and the insulation layer 10. In the present disclosure, hardness refers to Vickers hardness. Vickers hardness of the intermediate layer 9 is, for example, twice as high as or more than twice as high as Vickers hardness of the insulation layer 8 and the insulation layer 10.

The wire layer 5 is a primary coil of the transformer device 101 (one example of a first coil), and the wire layer 11 is a secondary coil of the transformer device 101 (one example of a second coil). The wire layer 5 and the wire layer 11 are each a planar coil. The wire layer 5 being a planar coil and the wire layer 11 being a planar coil are disposed to face each other. The transformer device 101 is a coreless transformer device that enables transmission of signals between a circuit connected to the wire layer 5 and a circuit connected to the wire layer 11 owing to magnetic coupling between the wire layer 5 being the primary coil and the wire layer 11 being the secondary coil. The wire layer 5 and the wire layer 11 are insulated from each other with the insulation layer 8 and the insulation layer 10. In order to insulate the wire layer 5 and the wire layer 11 from each other, it is desirable that the insulation layer 8 and the insulation layer 10 each have a thickness of 5 μm or more.

The transformer device 101 further includes a pad 14 and a pad 15. The pad 14 and the pad 15 are each provided on the insulation layer 4. Outer circumferential portions of the pad 14 and the pad 15 are covered by the insulation layer 7, and center portions of the pad 14 and the pad 15 are not covered by the insulation layer 7.

An end portion 13 located on the inner side in plan view, being one end portion of the circuit formed by the wire layer 5, is connected to the wire layer 3 through a contact via 6 penetrating the insulation layer 4 in the upper and lower directions. Further, an end portion located on the outer side in plan view, being another end portion of the circuit formed by the wire layer 5, is connected to the pad 15. The wire layer 3 is connected to the pad 14 through a contact via 40 penetrating the insulation layer 4 in the upper and lower directions. In other words, the wire layer 5 is connected to the pad 14 through the contact via 6, the wire layer 3, and the contact via 40.

The wire layer 3, the wire layer 5, the wire layer 11, the contact via 6, the contact via 40, the pad 14, the pad 15, the pad 21, and the pad 22 each have conductivity.

FIG. 2 is a plan view of the wire layer 11, the pad 21, and the pad 22. As illustrated in FIG. 2, in plan view, the wire layer 11 is formed into a spiral shape around the pad 21. An end portion located on the inner side in plan view, being one end portion of the circuit formed by the wire layer 11, is connected to the pad 21. An end portion located on the outer side in plan view, being another end portion of the circuit formed by the wire layer 11, is connected to the pad 22.

The circuit region 16 includes a pad 17 and a pad 18. The pad 17 and the pad 14 of the transformer device 101 are connected by a wire 19. The pad 18 and the pad 15 of the transformer device 101 are connected by a wire 20.

The circuit region 23 includes a pad 24 and a pad 25. The pad 24 and the pad 22 of the transformer device 101 are connected by a wire 26. The pad 25 and the pad 21 of the transformer device 101 are connected by a wire 27.

In the circuit region 16, an n-channel lateral MOSFET is formed with an n-type semiconductor region 50, an n-type semiconductor region 51, a p-type semiconductor region 52, a gate electrode 53, and an insulation film 54. The lateral MOSFET is connected to the pad 17 through a contact via 55, and can further be connected to an external circuit through a contact via 56. Similarly, a p-channel lateral MOSFET connected to the pad 18 through a contact via is formed in the circuit region 16, and the MOSFET can be connected to an external circuit through the contact via.

In the circuit region 23, an n-channel lateral MOSFET is formed with an n-type semiconductor region 60, an n-type semiconductor region 61, a p-type semiconductor region 62, a gate electrode 63, and an insulation film 64. The lateral MOSFET is connected to the pad 25 through a contact via 65, and can further be connected to an external circuit through a contact via 66. Similarly, a p-channel lateral MOSFET connected to the pad 24 through a contact via is formed in the circuit region 23, and the MOSFET can be connected to an external circuit through the contact via.

In the circuit region 16, for example, a semiconductor circuit may be formed. The semiconductor circuit is for controlling a current to flow in the wire layer 5, based on a signal to be transmitted to a circuit on the circuit region 23 side. Further, in the circuit region 23, a semiconductor circuit may be formed. The semiconductor circuit is, for example, for restoring a signal from a voltage that has occurred in the wire layer 11.

As described above, the transformer device 101 includes the wire layer 5 being a planar coil, the insulation layer 8 that is provided above the wire layer 5, the intermediate layer 9 that is provided above the insulation layer 8, the insulation layer 10 that is provided above the intermediate layer 9, the wire layer 11 being a planar coil that is provided above the insulation layer 10 and faces the wire layer 5 being a planar coil, and the pad 21 having conductivity that is provided above the insulation layer 10 and is connected to one end side of the wire layer 11. Further, the pad 21 is disposed at a position at least partially overlapping the intermediate layer 9 in plan view. The intermediate layer 9 has hardness higher than hardness of the insulation layer 8 and the insulation layer 10. With this configuration, quality of joining between the pad 21 and the wire 27 is enhanced.

A-2. Manufacturing Method

When the transformer device 101 is manufactured, for example, the substrate 1 is prepared, and then the insulation layer 2, the wire layer 3, the insulation layer 4, the contact via 6, the contact via 40, the wire layer 5, the pad 14, the pad 15, the insulation layer 7, the insulation layer 8, the intermediate layer 9, the insulation layer 10, the wire layer 11, the pad 21, the pad 22, and the insulation layer 12 are formed in the mentioned order.

The substrate 1 is, for example, a substrate using an element semiconductor such as a silicon semiconductor substrate. The substrate 1 may be a compound semiconductor substrate. The substrate 1 may be a wide-gap semiconductor substrate using SiC or GaN. The substrate 1 may be a Silicon on Insulator (SOI) substrate. The substrate 1 may be an insulator substrate using an insulator such as glass.

The insulation layer 2 is, for example, an $SiO_2$ layer. The $SiO_2$ layer as the insulation layer 2 is, for example, formed with a method of applying tetraethyl orthosilicate, tetraethoxysilane, (TEOS), or applying a solution containing $SiO_2$. When a semiconductor substrate is used as the substrate 1, the insulation layer 2 may be formed as a thermal oxide film.

A material of the wire layer 3, the wire layer 5, and the wire layer 11 is, for example, aluminum or a compound including aluminum, which is often used in a semiconductor process. The material of the wire layer 3, the wire layer 5, and the wire layer 11 may be other metal (for example, copper), or may be a conductor other than metal. The wire layer 3, the wire layer 5, and the wire layer 11 are each obtained by, for example, forming a metal layer to be a base with sputtering and then patterning the metal layer with wet etching or dry etching. The wire layer 3, the wire layer 5, and the wire layer 11 may be, for example, formed with plating.

The insulation layer 4 is, for example, an $SiO_2$ layer. The $SiO_2$ layer as the insulation layer 4 is, for example, formed with a method of applying TEOS, or applying a solution containing $SiO_2$.

The insulation layer 7 and the insulation layer 12 are each an SiN layer or a polyimide layer, for example, but may be an insulation layer formed using another material. One example of a method of forming the polyimide layer as the insulation layer 7 or the insulation layer 12 is a method of forming a layer with spin coating and then forming a pattern with exposure to light.

The insulation layer 8 and the insulation layer 10 are, for example, formed using polyimide, which is often used in a semiconductor process and has high dielectric strength. The insulation layer 8 and the insulation layer 10 may be organic insulation layers formed using an organic insulation material other than polyimide. Further, a material of the insulation layer 8 and a material of the insulation layer 10 may be different. If the insulation layer 8 and the insulation layer 10 are organic insulation layers, the insulation layer 8 and the insulation layer 10 can be formed inexpensively.

The intermediate layer 9 is, for example, formed using a conductor such as aluminum, which is often used in a semiconductor manufacture process and generally has hardness higher than that of the organic insulation layer. By forming the intermediate layer 9 with a method the same as that for forming the wire layer 3, the wire layer 5, and the wire layer 11, the intermediate layer 9 can be formed inexpensively. The intermediate layer 9 is, for example, metal, and is, for example, aluminum or copper, or a compound including one of these. The intermediate layer 9 may be an insulation layer such as a glass layer, for example, on the condition that the layer had hardness higher than that of the insulation layer 8 and the insulation layer 10. The intermediate layer 9 may be, for example, a layer of silicate glass.

The intermediate layer 9 is, for example, a nonmagnetic layer formed using a nonmagnetic material (in other words, a substance that is not a ferromagnetic material). The absolute value of volume magnetic susceptibility of the intermediate layer 9 is, for example, $1 \times 10^{-3}$ or less in the SI unit system. If a response to a magnetic field of the intermediate layer 9 is small, influence on magnetic coupling between the wire layer 5 and the wire layer 11 due to provision of the intermediate layer 9 can be reduced.

When the semiconductor device 200 is manufactured using the transformer device 101, the wire 27 is joined to the pad 21, and the wire 26 is joined to the pad 22. In the transformer device 101, the intermediate layer 9 having hardness higher than that of the insulation layer 8 and the insulation layer 10 is formed between the insulation layer 8 and the insulation layer 10 that insulate the wire layer 5 and the wire layer 11 from each other. Further, the pad 21 is disposed at a position at least partially overlapping the intermediate layer 9 in plan view. Thus, the insulation layer 8 and the insulation layer 10 are less liable to be deformed against a pressure applied from above when the wire 27 is joined to the pad 21. With this configuration, joining between the pad 21 and the wire 27 is enhanced, and the wire 27 can be joined to the pad 21 with high quality. Further, owing to such enhanced quality of joining between the pad 21 and the wire 27, quality of the semiconductor device 200 is enhanced.

A-3. Modifications

In the semiconductor device 200 illustrated in FIG. 1, the transformer device 101, the circuit region 16, and the circuit region 23 are illustrated as separate chips; however, one or both of the circuit region 16 and the circuit region 23 may be formed in the identical chip as the transformer device 101. Further, when the circuit region 16 or the circuit region 23 is formed in the identical chip as the transformer device 101, the primary coil or the secondary coil of the transformer device 101 and the circuit region 16 or the circuit region 23 may be connected not with a wire but with a wire layer formed in the chip.

FIG. 3 illustrates the semiconductor device 200 when the circuit region 16 is formed in the identical chip as the transformer device 101. In the semiconductor device 200 illustrated in FIG. 3, the circuit region 16 and the wire layer 5 are connected by a wire layer 41 and the wire layer 3. In the chip in which the transformer device 101 is formed, a circuit of a MOSFET or the like different from the one illustrated in FIG. 3 may be formed.

The semiconductor device 200 illustrated in FIG. 1 or FIG. 3 includes the transformer device 101 as a transformer device; however, the semiconductor device 200 may include a transformer device according to each embodiment to be described later instead of the transformer device 101.

The present embodiment describes, as a typical example of the transformer device 101, a configuration in which the primary coil is formed as the wire layer 5 and the wire layer 5 and the pad 14 are connected through the wire layer 3 below the wire layer 5; however, yet another wire layer may be formed above and below the wire layer 3 and the wire layer 5.

Further, the transformer device 101 may have a configuration as illustrated in FIG. 4 instead of FIG. 1. In the transformer device 101 having a configuration illustrated in FIG. 4, as against the configuration illustrated in FIG. 1, the wire layer 3 and the insulation layer 4 are omitted, and further, the wire layer 5 and the pad 14 are connected through the diffusion layer 30 formed in the substrate 1. The one end portion 13 of the wire layer 5 and the diffusion layer 30 are connected by a contact via 28, and the pad 14 and the diffusion layer 30 are connected by a contact via 29. In the configuration illustrated in FIG. 4, the substrate 1 is a semiconductor substrate, and the diffusion layer 30, the contact via 28, and the contact via 29 are formed using a regular semiconductor manufacture process.

B. Second Embodiment

FIG. 5 illustrates a transformer device 102 according to the second embodiment.

The transformer device 102 is different from the transformer device 101 according to the first embodiment in that the intermediate layer 9 is formed to cover the entire upper surface and side surface of the insulation layer 8. The transformer device 102 is the same as the transformer device 101 in other configurations.

In the transformer device 102, deterioration of insulation between the primary coil and the secondary coil due to a damage caused to the insulation layer 8 at the time of etching performed when a pattern of the intermediate layer 9 is formed can be forestalled owing to the configuration that the entire upper surface and side surface of the insulation layer 8 are covered by the intermediate layer 9 at the time of the etching.

C. Third Embodiment

FIG. 6 is a diagram illustrating a transformer device 103 according to the third embodiment.

The transformer device 103 is different from the transformer device 101 according to the first embodiment in that a partial region of the intermediate layer 9 in plan view enters the inside of the insulation layer 8 from the upper side of the insulation layer 8. The transformer device 103 is the same as the transformer device 101 in other configurations. In particular, in the transformer device 103 as well, similarly to the case of the transformer device 101, the intermediate layer 9 has hardness higher than that of the insulation layer 8 and the insulation layer 10, and further, the pad 21 is disposed at a position at least partially overlapping the intermediate layer 9 in plan view.

In the transformer device 103, owing to the configuration that a partial region of the intermediate layer 9 in plan view enters the inside of the insulation layer 8 from the upper side of the insulation layer 8, the effect that the insulation layer 8 and the insulation layer 10 are less liable to be deformed at the time of joining a wire to the pad 21 is further enhanced. With this configuration, a wire can be joined to the pad 21 with high quality. Further, adhesion between the intermediate layer 9 and the insulation layer 8 is enhanced, making the intermediate layer 9 and the insulation layer 8 less liable to separate from each other.

D. Fourth Embodiment

FIG. 7 is a diagram illustrating a transformer device 104 according to the fourth embodiment.

The transformer device 104 is different from the transformer device 101 according to the first embodiment in that a partial region of the intermediate layer 9 in plan view penetrates the insulation layer 8 in the upper and lower directions to come in contact with the insulation layer 7. The transformer device 104 is the same as the transformer device 101 in other configurations. In particular, in the transformer device 104, similarly to the case of the transformer device 101, the intermediate layer 9 has hardness higher than that of the insulation layer 8 and the insulation layer 10, and further, the pad 21 is disposed at a position at least partially overlapping the intermediate layer 9 in plan view.

The transformer device 104 has effects similar to those of the transformer device 103 according to the third embodiment. Further, when hardness of the insulation layer 7 is higher than hardness of the insulation layer 8, owing to the configuration that the intermediate layer 9 comes in contact with the insulation layer 7, deformation of the intermediate layer 9 at the time of joining a wire to the pad 21 can be reduced, and as a result, a wire can be joined to the pad 21 with high quality.

E. Fifth Embodiment

FIG. 8 is a diagram illustrating a transformer device 105 according to the fifth embodiment.

FIG. 9 is a plan view extracting the insulation layer 8 and the intermediate layer 9 of the transformer device 105 according to the fifth embodiment. In FIG. 9, regarding the insulation layer 8, only a part thereof near the intermediate layer 9 is illustrated. Further, in FIG. 9, disposition of the pad 21 is indicated by the broken line.

The transformer device 105 is different from the transformer device 101 according to the first embodiment in that a hole penetrating in the upper and lower directions is provided in the intermediate layer 9. The transformer device 105 is the same as the transformer device 101 in other configurations. In particular, in the transformer device 105 as well, similarly to the case of the transformer device 101, the intermediate layer 9 has hardness higher than that of the insulation layer 8 and the insulation layer 10, and further, the pad 21 is disposed at a position at least partially overlapping the intermediate layer 9 in plan view.

A plurality of such holes penetrating in the upper and lower directions may be provided in the intermediate layer 9.

In the transformer devices according to the second to fourth embodiments, the hole(s) penetrating in the upper and lower directions may be provided in the intermediate layer 9.

A crack may be generated in the intermediate layer 9 when a pressure at the time of joining a wire to the pad 21 or other stress is applied to the intermediate layer 9. However, owing to the provision of the hole(s) penetrating in the upper and lower directions in the intermediate layer 9, the generation of a crack when a pressure or a stress is applied to the intermediate layer 9 can be reduced.

F. Sixth Embodiment

FIG. 10 is a diagram illustrating a transformer device 106 according to the sixth embodiment.

The transformer device 106 is different from the transformer device 101 according to the first embodiment in that the transformer device 106 further includes an insulation layer 31 between the insulation layer 8 and the intermediate layer 9. The insulation layer 31 is provided to cover the entire upper surface and side surface of the insulation layer 8. The transformer device 106 is the same as the transformer device 101 in other configurations. In particular, in the transformer device 106 as well, similarly to the case of the transformer device 101, the intermediate layer 9 has hardness higher than that of the insulation layer 8 and the insulation layer 10, and further, the pad 21 is disposed at a position at least partially overlapping the intermediate layer 9 in plan view.

The insulation layer 31 may be added to the transformer devices according to the second to fifth embodiments.

Owing to the inclusion of the insulation layer 31, damage to the insulation layer 8 due to a process such as etching when the intermediate layer 9 is formed can be avoided.

Further, the insulation layer 31 may be partially removed in a process after the intermediate layer 9 is formed, and the insulation layer 31 may be formed in a part on the main surface of the insulation layer 8 as illustrated in FIG. 11. Further, the insulation layer 31 may be formed not entirely but in a partial region below the intermediate layer 9, and a partial region of the intermediate layer 9 in plan view may come in contact with the insulation layer 8.

The insulation layer 31 may be an insulation layer using an insulator often used in a semiconductor process, such as $SiO_2$ or SiN. Alternatively, the insulation layer 31 may be an inorganic insulation layer made of another material. When the insulation layer 31 is partially removed in a process after the intermediate layer 9 is formed, it is desirable that the insulation layer 31 be such an insulation layer that causes only minor damage to the insulation layer 8 or that causes no damage to the insulation layer 8 in the removal process.

The thickness of the insulation layer 31 is, for example, smaller than that of the insulation layer 8 and the insulation layer 10. By arranging the thickness of the insulation layer 31 to be 1 μm or less, for example, additional costs incurred due to formation of the insulation layer 31 can be reduced.

G. Seventh Embodiment

FIG. 12 is a diagram illustrating a transformer device 107 according to the seventh embodiment.

As against the transformer device 101 according to the first embodiment, the transformer device 107 has a configuration in which an insulation layer 32 is added between the insulation layer 8 and the insulation layer 10. The transformer device 107 is the same as the transformer device 101 in other configurations. In particular, in the transformer device 107 as well, the pad 21 is disposed at a position at least partially overlapping the intermediate layer 9 in plan view. Further, the transformer device 107, the intermediate layer 9 has hardness higher than that of the insulation layer 8, the insulation layer 10, and the insulation layer 32.

The insulation layer 32 is formed using polyimide, for example. The insulation layer 32 may be an organic insulation layer formed using an organic insulation material other than polyimide. The insulation layer 32 may be added between the insulation layer 8 and the insulation layer 10 in the transformer device according to any one of the second to sixth embodiments.

In comparison to the transformer device 101, the transformer device 107 has a larger total thickness of the insulation layers between the wire layer 5 and the wire layer 11, and thus insulation performance between the wire layer 5 and the wire layer 11 is enhanced. Further, by increasing the number of layers, a total thickness of the insulation layers between the wire layer 5 and the wire layer 11 can be easily increased. In the transformer device 107, the fact that the insulation layer 8 and the insulation layer 32 are formed as different layers can be confirmed through observation of a cross-section as illustrated in. FIG. 12, for example.

A case where the intermediate layer 9 is formed on the upper surface of the insulation layer 32 is desirable in comparison to a case where the intermediate layer 9 is formed on the upper surface of the insulation layer 8, because deformation around the pad 21 at the time of joining a wire to the pad 21 can be further reduced, and quality of joining between the pad 21 and the wire can be enhanced. Note that, also in a case where the intermediate layer 9 is formed on the upper surface of the insulation layer 8, the effects of reducing deformation around the pad 21 and enhancing quality of joining between the pad 21 and the wire can be obtained. Further, in order to further enhance insulation performance between the wire layer 5 and the wire layer 11, yet another insulation layer may be added apart from the insulation layer 8, the insulation layer 32, and the insulation layer 10. In other words, insulation layers of three or more layers including the insulation layer 8 and the insulation layer 10 may be stacked in the upper and lower directions between the wire layer 5 and the wire layer 11. In this case as well, with the intermediate layer 9 being disposed at some position between the insulation layers of three or more layers, and hardness of the intermediate layer 9 being higher than hardness of each of the insulation layers of three or more layers, the effects of reducing deformation around the pad 21 and enhancing quality of joining between the pad 21 and the wire can be obtained. Further, if the insulation layers of three or more layers are, for example, organic insulation layers, the insulation layers of three or more layers can be inexpensively formed.

Note that each embodiment can be freely combined, and each embodiment can be modified or omitted as appropriate.

While the disclosure has been shown and described in detail, the foregoing description is in all aspects illustrative and not restrictive. It is therefore understood that numerous modifications and variations can be devised.

What is claimed is:

1. A transformer device comprising:
   a planar first coil;
   a first insulation layer being provided above the first coil;
   an intermediate layer being provided above the first insulation layer;
   a second insulation layer being provided above the intermediate layer;
   a planar second coil being provided on an upper surface of the second insulation layer and facing the first coil; and
   a pad having conductivity being provided above the second insulation layer and being connected to one end side of the second coil, wherein
   the pad is disposed at a position at least partially overlapping the intermediate layer in plan view,
   the intermediate layer has hardness higher than hardness of the first insulation layer and the second insulation layer, and
   the intermediate layer covers an entire upper surface and side surface of the first insulation layer.

2. The transformer device according to claim 1, wherein the first insulation layer and the second insulation layer are each an organic insulation layer.

3. The transformer device according to claim 1, wherein the first insulation layer and the second insulation layer contain polyimide.

4. The transformer device according to claim 1, wherein the intermediate layer is a conductor.

5. The transformer device according to claim 4, wherein the intermediate layer contains aluminum or copper.

6. The transformer device according to claim 2, further comprising:
   an inorganic insulation layer being provided on an upper surface of the first insulation layer, wherein
   at least a part of the intermediate layer is provided on an upper surface of the inorganic insulation layer, and
   thickness of the inorganic insulation layer is 1 μm or less.

7. The transformer device according to claim 6, wherein the inorganic insulation layer covers an upper surface and side surface of the first insulation layer.

8. The transformer device according to claim 2, wherein organic insulation layers of three or more layers including the first insulation layer and the second insulation layer are stacked in upper and lower directions between the first coil and the second coil.

9. The transformer device according to claim 1, wherein insulation layers of three or more layers including the first insulation layer and the second insulation layer are stacked in upper and lower directions between the first coil and the second coil, and the intermediate layer has hardness higher than hardness of each of the insulation layers of the three or more layers.

10. The transformer device according to claim 1, wherein a partial region of the intermediate layer in plan view enters inside of the first insulation layer from an upper side of the first insulation layer.

11. The transformer device according to claim 1, further comprising:

a third insulation layer being provided above the first coil and below the first insulation layer, wherein the third insulation layer has hardness higher than hardness of the first insulation layer, and a partial region of the intermediate layer in plan view penetrates the first insulation layer and comes in contact with the third insulation layer.

12. The transformer device according to claim 1, wherein a hole penetrating in upper and lower directions is provided in the intermediate layer.

13. The transformer device according to claim 1, wherein the first insulation layer and the second insulation layer each have thickness of 5 µm or more.

14. The transformer device according to claim 1, wherein the intermediate layer is a nonmagnetic layer.

15. A transformer device comprising:

a planar first coil;

a first insulation layer being provided above the first coil;

an intermediate layer being provided above the first insulation layer;

a second insulation layer being provided above the intermediate layer;

a planar second coil being provided on an upper surface of the second insulation layer and facing the first coil; and a pad having conductivity being provided above the second insulation layer and being connected to one end side of the second coil, wherein the pad is disposed at a position at least partially overlapping the intermediate layer in plan view, the first insulation layer and the second insulation layer are each an organic insulation layer, the intermediate layer is a metal layer or a glass layer, and the intermediate layer covers an entire upper surface and side surface of the first insulation layer.

16. The transformer device according to claim 15, wherein the first insulation layer and the second insulation layer contain polyimide.

17. The transformer device according to claim 15, wherein the intermediate layer contains aluminum or copper.

18. The transformer device according to claim 15, further comprising:

an inorganic insulation layer being provided on an upper surface of the first insulation layer, wherein at least a part of the intermediate layer is provided on an upper surface of the inorganic insulation layer, and thickness of the inorganic insulation layer is 1 µm or less.

19. The transformer device according to claim 18, wherein the inorganic insulation layer covers an upper surface and side surface of the first insulation layer.

20. The transformer device according to claim 15, wherein organic insulation layers of three or more layers including the first insulation layer and the second insulation layer are stacked in upper and lower directions between the first coil and the second coil.

21. The transformer device according to claim 15, wherein insulation layers of three or more layers including the first insulation layer and the second insulation layer are stacked in upper and lower directions between the first coil and the second coil, and the intermediate layer has hardness higher than hardness of each of the insulation layers of the three or more layers.

22. The transformer device according to claim 15, wherein a partial region of the intermediate layer in plan view enters inside of the first insulation layer from an upper side of the first insulation layer.

23. The transformer device according to claim 15, further comprising:

a third insulation layer being provided above the first coil and below the first insulation layer, wherein the third insulation layer has hardness higher than hardness of the first insulation layer, and a partial region of the intermediate layer in plan view penetrates the first insulation layer and comes in contact with the third insulation layer.

24. The transformer device according to claim 15, wherein a hole penetrating in upper and lower directions is provided in the intermediate layer.

25. The transformer device according to claim 15, wherein the first insulation layer and the second insulation layer each have thickness of 5 µm or more.

26. The transformer device according to claim 15, wherein the intermediate layer is a nonmagnetic layer.

27. A semiconductor device comprising:

the transformer device according to claim 1; and a semiconductor circuit being electrically connected to the first coil or the second coil.

28. The semiconductor device according to claim 27, wherein the transformer device and the semiconductor circuit are formed in an identical chip.

29. A semiconductor device comprising:

the transformer device according to claim 15; and a semiconductor circuit being electrically connected to the first coil or the second coil.

30. The semiconductor device according to claim 29, wherein the transformer device and the semiconductor circuit are formed in an identical chip.

* * * * *